(12) United States Patent
Son

(10) Patent No.: US 6,869,891 B2
(45) Date of Patent: Mar. 22, 2005

(54) SEMICONDUCTOR DEVICE HAVING GROOVE AND METHOD OF FABRICATING THE SAME

(75) Inventor: Nak-jin Son, Suwon (KR)

(73) Assignee: Samsung Electronics, Co., LTD, Kyungki-do (KR)

(*) Notice: Subject to any disclaimer, the term of this patent is extended or adjusted under 35 U.S.C. 154(b) by 0 days.

(21) Appl. No.: 10/127,625

(22) Filed: Apr. 22, 2002

(65) Prior Publication Data

US 2003/0068875 A1 Apr. 10, 2003

(30) Foreign Application Priority Data

Oct. 9, 2001 (KR) ........................................ 2001-62155

(51) Int. Cl.[7] ........................ H01L 21/31; H01L 21/469
(52) U.S. Cl. ........................ 438/766; 438/270; 438/423; 438/689; 438/770; 438/966
(58) Field of Search ........................ 438/270, 423, 438/440, 443, 480, 520, 522, 528, 530, 585, 587, 591, 689, 770, 766, 966, 259

(56) References Cited

U.S. PATENT DOCUMENTS 5,895,252 A * 4/1999 Lur et al. ............... 438/423
6,136,674 A * 10/2000 An et al. ............... 438/585

FOREIGN PATENT DOCUMENTS

JP 6224424 8/1994

* cited by examiner

*Primary Examiner*—Asok Kumar Sarkar
(74) *Attorney, Agent, or Firm*—F. Chau & Associates, LLC

(57) ABSTRACT

A method for forming a plurality of grooves of a semiconductor device having of a plurality of MOS transistors is provided. A plurality of photoresist patterns are formed on a semiconductor substrate. Ions are implanted on a portion of the semiconductor substrate using the plurality of photoresist patterns as a mask. The plurality of photoresist patterns are removed. An oxide layer is formed on the semiconductor substrate having the implanted ions by thermal oxidation. The plurality of grooves are formed on the semiconductor substrate by removing the oxide layer.

12 Claims, 14 Drawing Sheets

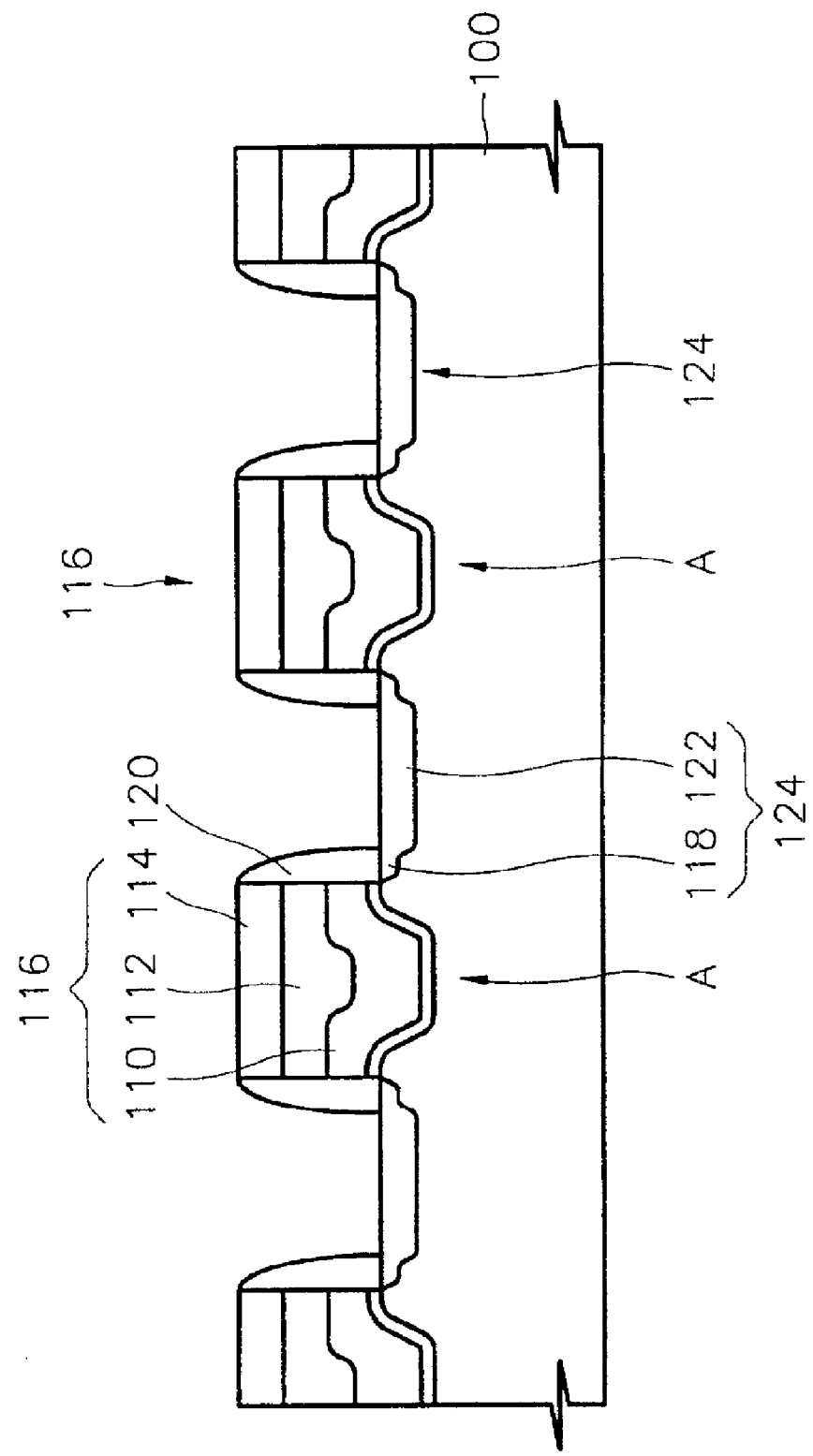

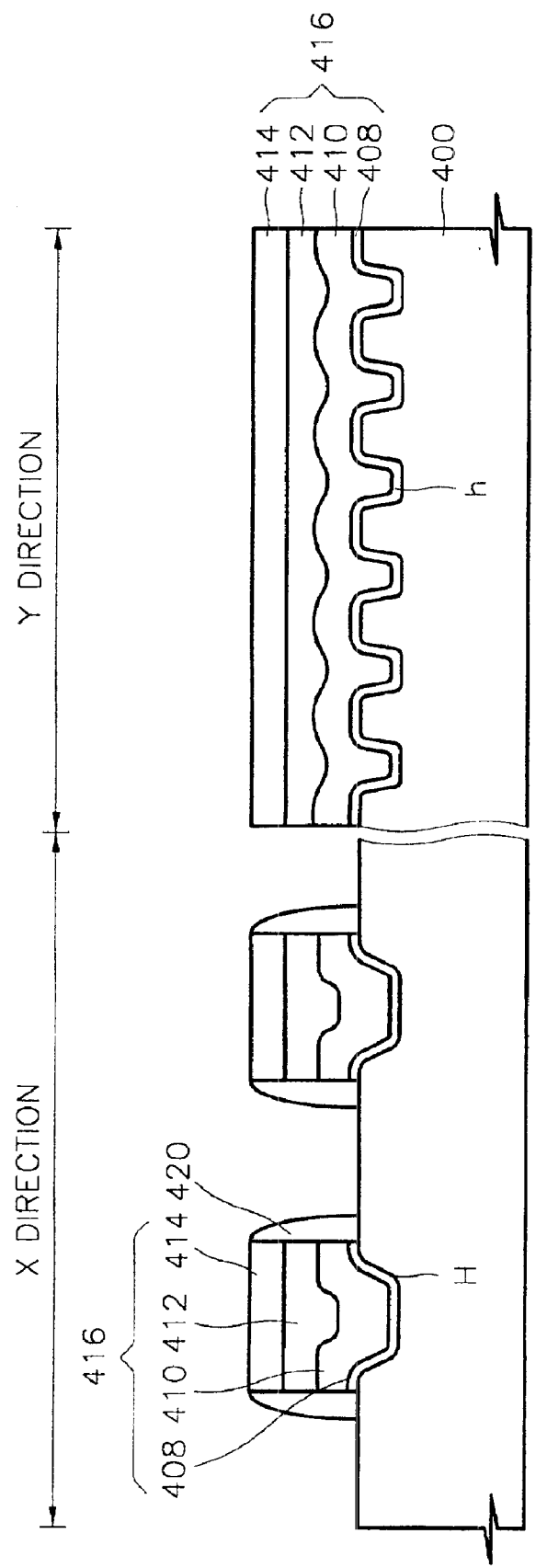

SEMICONDUCTOR DEVICE HAVING GROOVE AND METHOD OF FABRICATING THE SAME

BACKGROUND OF THE INVENTION

1. Field of the Invention

The present invention relates to a semiconductor device and a method of fabricating the same and, more particularly, to a semiconductor device capable of increasing an effective channel length and width, which has a plurality of grooves and a method of fabricating the same.

2. Description of the Related Art

As semiconductor memory devices are highly integrated, a width of a gate electrode of a MOS transistor is reduced to about 0.1 µm and a channel length of the MOS transistor must be reduced. With reduced channel length, electrons can easily pass a gate insulating layer of the MOS transistor, and the so called "hot carrier effect" occurs because an electric field between a source and a drain of the MOS transistor is strengthen by the reduced channel length, causing flow of leakage current. Thus, the short channel effect from a reduced channel length of the MOS transistor adversely affects characteristics of the MOS transistor.

One way to alleviate the short channel effect is by elongating the channel length without changing a design rule of the gate electrode.

FIGS. 1A to 1C are cross-sectional views of structures illustrating a conventional fabricating method of a semiconductor device having grooves for elongation of effective channel length.

Referring to FIG. 1A, nitride layer patterns 12 are formed on a semiconductor substrate 10 having a device isolation layer (not shown) to expose a channel region of a MOS transistor. Next, insulating layer spacers 14 are formed on both lateral sides of the nitride layer patterns 12. Then, a thermal oxide layer 16 is formed on an exposed semiconductor substrate 10 by a thermal oxidation process.

Referring to FIG. 1B, the thermal oxide layer 16 and the insulating spacers 14 are removed by a wet etching process to form a groove 18. Next, ions 20 are implanted on the semiconductor substrate 10 adjacent to the groove 18 for controlling a threshold voltage. Next, a gate insulating layer 22 is deposited on the semiconductor substrate 10 having the groove 18 at a predetermined thickness, and a polysilicon layer 24 is deposited on the semiconductor substrate 10 having the gate insulating layer 22 to fully fill the groove 18 between the nitride layer patterns 12. The polysilicon layer 24 is planarized to form a gate electrode 24 by a chemical mechanical polishing (CMP) process until the nitride layer pattern 12 is exposed.

Referring to FIG. 1C, the nitride layer pattern 12 formed on both lateral sides of the gate electrode 24 is removed, and spacers 28 are formed on both lateral sides of the gate electrode 24. Conjunction regions 26 and 30 having a lightly doped drain (LDD) are formed beneath the spacers 28 and adjacent to the bottom of the spacers 28. As a result, a channel is formed under the gate electrode 24. The channel is formed to be elongated since the bottom surface of the gate electrode has a groove.

However, as design rule of the gate electrode 24 is about 0.1 µm, the distance between the nitride patterns 12 should be within the design rule. During the thermal oxidation process for forming the thermal oxide layer 16, the semiconductor substrate 10 is subject to severe stress because of the nitride layer pattern 12, even if the spacers 14 are formed. Further, when the thermal oxidation process is partially performed, a bird's beak can be easily formed, thereby making difficult the forming of a delicate groove. Thus, there still continues to be a need for an improved fabricating method for elongating an effective channel length and width to improve current characteristics of a semiconductor device.

SUMMARY OF THE INVENTION

A method for forming a plurality of grooves of a semiconductor device having of a plurality of MOS transistors is provided, which includes the steps of: forming a plurality of photoresist patterns on a semiconductor substrate; implanting ions on the semiconductor substrate using the plurality of photoresist patterns as a mask; removing the plurality of photoresist patterns; forming an oxide layer on the semiconductor substrate having the implanted ions by thermal oxidation; and forming the plurality of grooves on the semiconductor substrate by removing the oxide layer.

According to an embodiment of the present invention, each of the plurality of photoresist patterns is spaced apart from another on a plurality of channel regions of the plurality of MOS transistors to expose the plurality of channel regions in the semiconductor substrate. The ions are oxygen ions and the oxide layer is formed thicker in a portion of the semiconductor substrate having the oxygen ions than in a portion of the semiconductor substrate not having the oxygen ions. The plurality of photoresist patterns are formed on a corresponding plurality of channel regions of the plurality of MOS transistors. The ions are nitrogen ions and the oxide layer is formed on a portion of the semiconductor substrate not having the nitrogen ions. A plurality of channel regions are formed parallel to a channel length and the plurality of the photoresist patterns are disposed along the longitudinal direction to expose the plurality of channel regions. The ions are oxygen ions and the oxide layer is formed thicker in a portion of the semiconductor substrate having the oxygen ions than in a portion of the semiconductor substrate not having the oxygen ions. The ions are nitrogen ions and the oxide layer is formed on a portion of the semiconductor substrate not having the nitrogen ions.

According to an embodiment of the present invention, the step of forming the plurality of photoresist patterns includes the steps of: forming a plurality of first photoresist patterns, each of the plurality of first photoresist patterns is disposed in between channel regions of the plurality of the MOS transistors; forming a plurality of second photoresist patterns between each of the plurality of first photoresist patterns, the plurality of second photoresist patterns being orthogonal to the plurality of first photoresist patterns. A width of each of the plurality of grooves is the same or smaller than a channel region.

According to an embodiment of the present invention, the method further includes the steps of: forming a gate electrode on the gate insulating layer; and forming junction regions in both sides of the gate electrode.

A semiconductor device is also provided, which includes: a semiconductor substrate; a plurality of gate electrodes on the semiconductor substrate, each of the plurality of gate electrodes being disposed along a longitudinal direction; a conjunction region having impurities formed between each of the plurality of gate electrodes; a plurality of grooves disposed under each of the plurality of gate electrodes along the longitudinal direction of the plurality of gate electrodes.

According to an embodiment of the present invention, the semiconductor device further includes a plurality of grooves disposed under each of the plurality of gate electrodes along a direction orthogonal to the longitudinal direction of each of the plurality of gate electrodes. A width of each of the first plurality of grooves in the longitudinal direction is substantially the same as or smaller than the width of each of the plurality of gate electrodes. A width of each of the plurality of grooves in the orthogonal direction is smaller than the width of each of the plurality of grooves in the longitudinal direction. The conjunction region is a lightly doped drain (LDD) type.

BRIEF DESCRIPTION OF THE DRAWINGS

The above and other objects and advantages of the present invention will become more apparent by describing in detail preferred embodiments thereof with reference to the accompanying drawings in which:

FIGS. 3A to 3F are cross-sectional views of structures illustrating a fabricating method of a semiconductor device having grooves according to an embodiment of the present invention;

FIGS. 10A and 10B are cross-sectional views of structures illustrating a fabricating method of a semiconductor device having grooves according to another embodiment of the present invention.

DETAILED DESCRIPTION OF PREFERRED EMBODIMENTS

Hereinafter, embodiments of the present invention will be described in detail with reference to the attached drawings. However, the embodiments of the present invention may be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity. Like numbers refer to like elements throughout. Also, when it is written that a layer is formed "on" another layer or a substrate, the layer may be formed directly on the other layer or the substrate, or other layers may intervene therebetween.

Figure 1A:
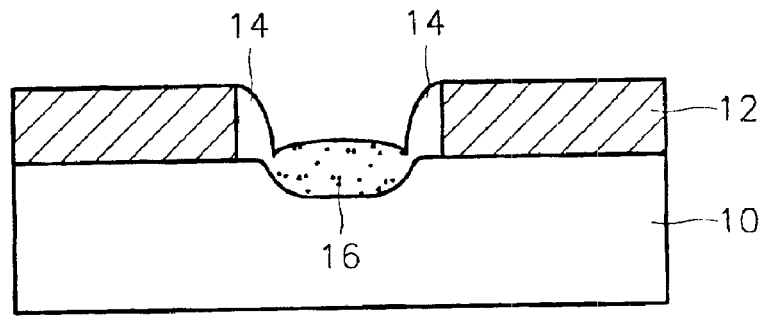
FIGS. 1A to 1C are cross-sectional views of structures illustrating a conventional fabricating method of a semiconductor device having grooves for elongation of effective channel length.
Figure 1B:
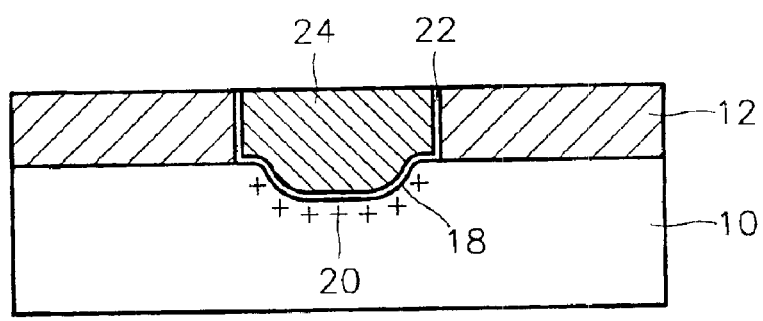
Figure 1C:
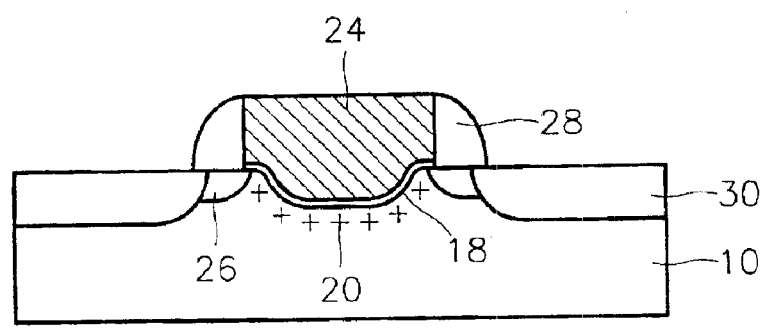
Figure 2:
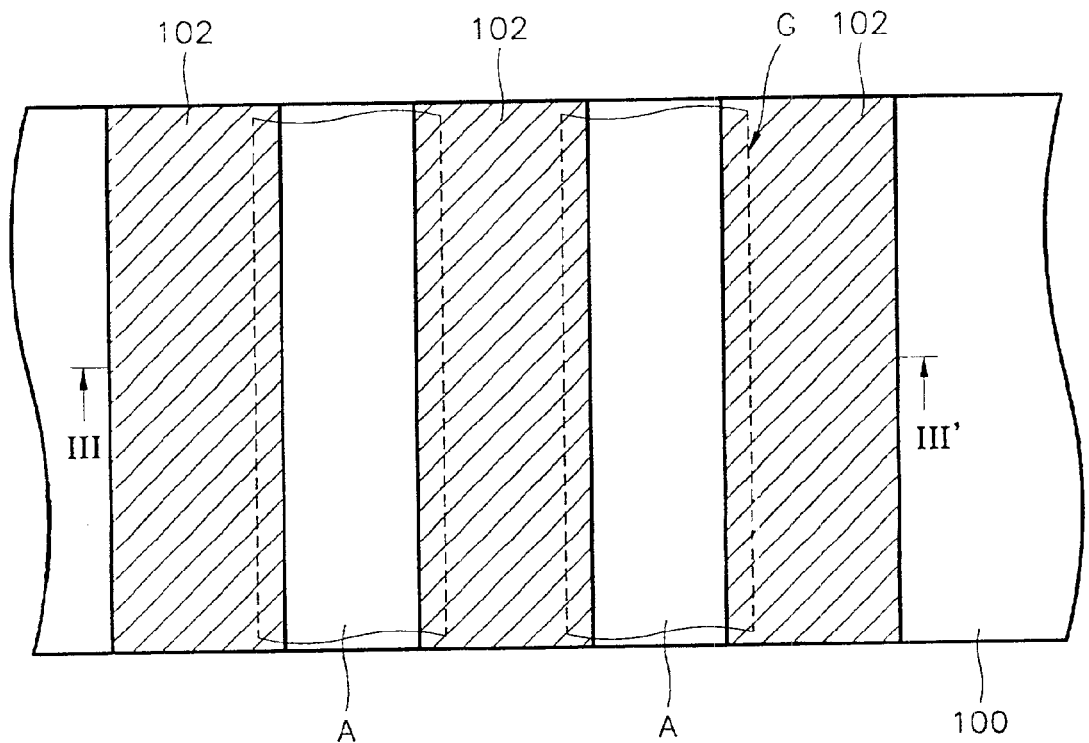
FIG. 2 is a plan view of photoresist patterns according to an embodiment of the present invention.
Figure 3A:
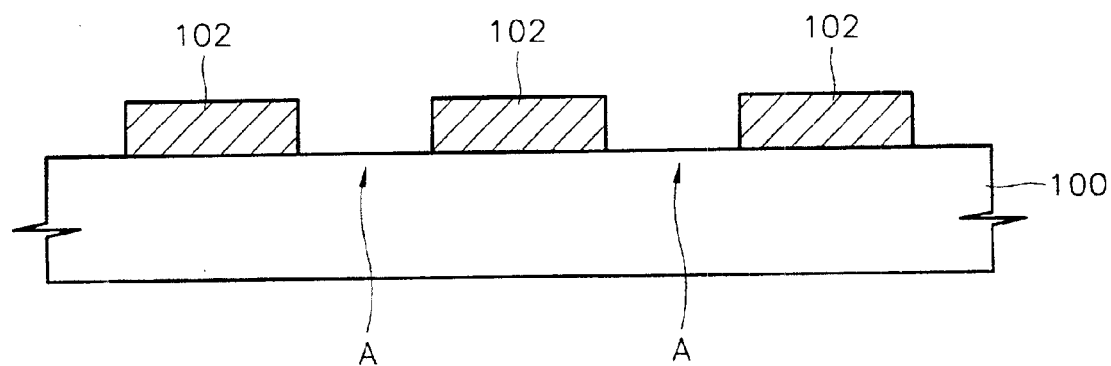

FIG. 2 is a plan view of photoresist patterns according to a first embodiment of the present invention. FIGS. 3A to 3F are cross-sectional views of structures illustrating a fabricating method of a semiconductor device having grooves according to the first embodiment of the present invention. In particular, FIG. 3A is a cross-sectional view taken along the III–III' line of FIG. 2.

Referring to FIGS. 2 and 3A, a plurality of photoresist patterns 102 are formed on a semiconductor substrate 100. The plurality of photoresist patterns 102 are in strips to expose channel regions A (to be formed) of a plurality of MOS transistors (not shown). According to an embodiment of the present invention, the distance between the plurality of photoresist patterns 102 has a similar width of each channel region A or a smaller than the width of each channel region A. A reference symbol G denotes a region for forming a plurality of gate electrodes (to be formed), and the plurality of photoresist patterns 102 are disposed in parallel to the plurality of gate electrodes.

Figure 3B:
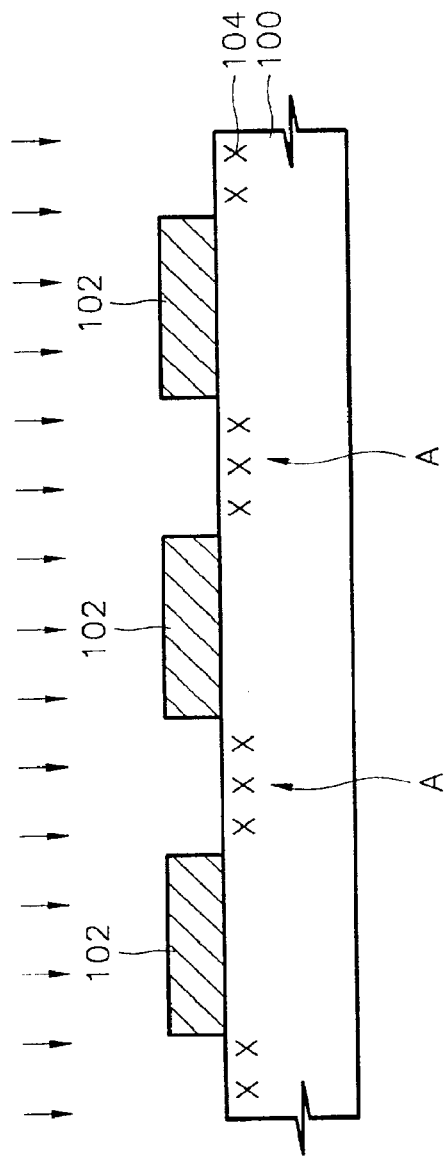

Referring to FIG. 3B, oxygen ions 104 are implanted into the semiconductor substrate 100. The oxygen ions 104 are implanted into the channel regions using the plurality of photoresist patterns 102 as a mask.

Figure 3C:
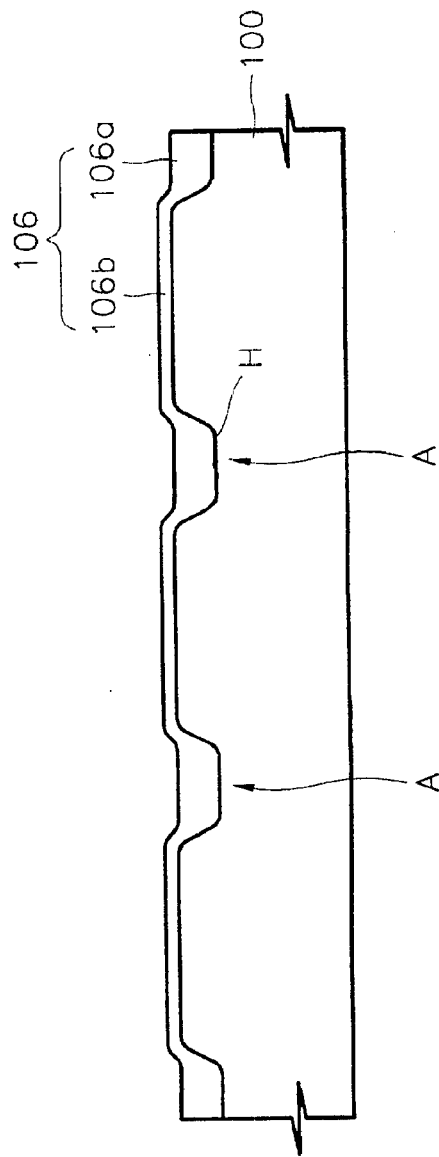

Referring to FIG. 3C, the photoresist patterns 102 are removed using a known method such as an ashing process. Next, a thermal oxide layer 106 is formed on the semiconductor substrate 100 by a thermal oxidation process. The thermal oxide layer 106 in a portion having the implanted oxygen ions 104 is formed thicker as shown in the number 106a, the thermal oxide layer 106 in a portion not having the implanted oxygen ions 104, that is, the photoresist patterns 102 (in FIG. 3B) are formed, is formed thinner as compared to the thermal oxide layer 106a. Thus, implantation of the oxygen ions 104 to the semiconductor substrate 100 makes an oxidation reaction faster, thereby forming the thermal oxide layer 106a thicker.

Figure 3D:
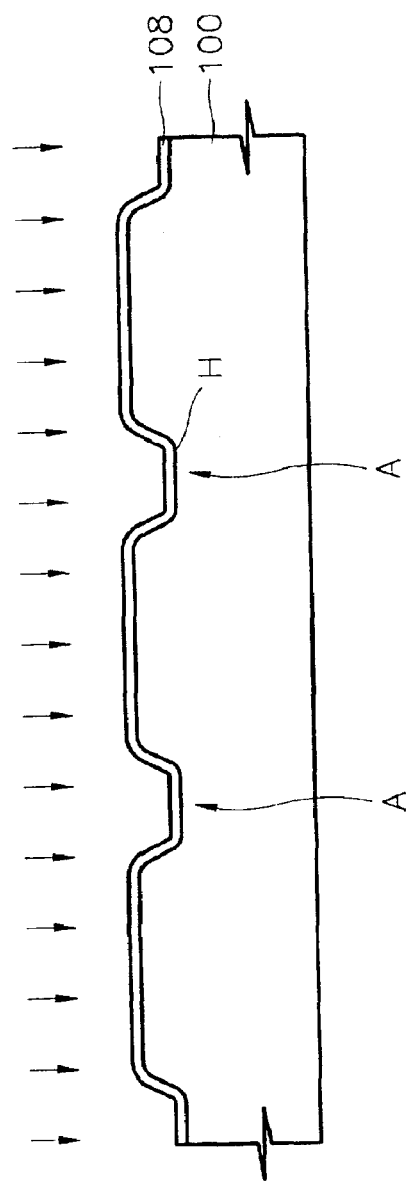

Referring to FIG. 3D, the thermal oxide layer 106 (in FIG. 3C) is removed by a wet etching process. Then, a plurality of grooves H are formed in the channel region A of the semiconductor substrate 100, and the semiconductor substrate 100 has an even surface. According to an embodiment of the present invention, a width of each of plurality of grooves H is similar to the channel length or smaller than the channel length. Next, the semiconductor substrate 100 is cleaned, and then, a gate insulating layer 108 is formed on the semiconductor substrate 100 having the plurality of grooves H.

Figure 3E:
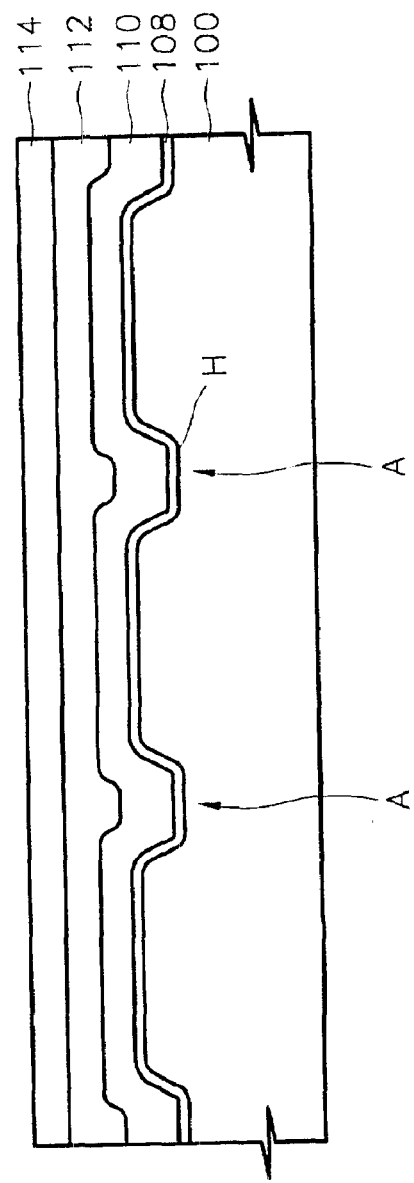

Referring to FIG. 3E, a conducting layer 110 for a gate electrode and a low resistance layer 112 are formed on the gate insulating layer 108. According to an embodiment of the present invention, threshold voltage controlling ions (not shown) are implanted to the semiconductor substrate 100 having the gate insulating layer 108 before forming the conducting layer 110. Next, the low resistance layer 112 is planarized by using an etch back process or a CMP process. Next, a hard mask layer 114 is formed on the planarized low resistance layer 112. According to an embodiment of the present invention, the conducting layer 110 is preferably formed with an impurity doped polysilicon layer or an impurity doped amorphous silicon layer, the low resistance layer 112 is preferably formed with a transition metal layer or a transition metal silicide layer, and the hard mask layer 114 is preferably formed with a silicon nitride layer or a silicon oxynitride layer.

Referring to FIG. 3F, a plurality of gate electrodes 116 are formed by sequentially patterning a portion of the hard mask layer 114, a portion of the low resistance layer 112, a portion of the conducting layer 110, and a portion of the gate insulating layer 108. As a result, the plurality of grooves H are formed under the plurality of gate electrodes 116. Next, impurities having a low concentration are implanted to the semiconductor substrate 110 between both sides of each of the plurality of gate electrodes 116, thereby forming low concentration impurity regions 118 between both sides of each gate electrode 116. Next, spacers 120 are formed at both sides of each of the plurality of gate electrodes 116 with insulating material. Next, impurities having a high concentration are implanted to the semiconductor substrate 100 between both sides of spacers, thereby forming high concentration impurity regions 122 between both sides of each spacer 120. Thus, LDD type conjunction regions 124 are formed between the plurality of gate electrodes 116. The conjunction regions 124 can be also formed with different methods.

According to an embodiment of the present invention, the grooves are formed under the gate electrodes without forming a nitride layer pattern. Therefore, the effective channel length of the MOS transistor can be elongated without being subject to stress in the semiconductor substrate.

Figure 4:
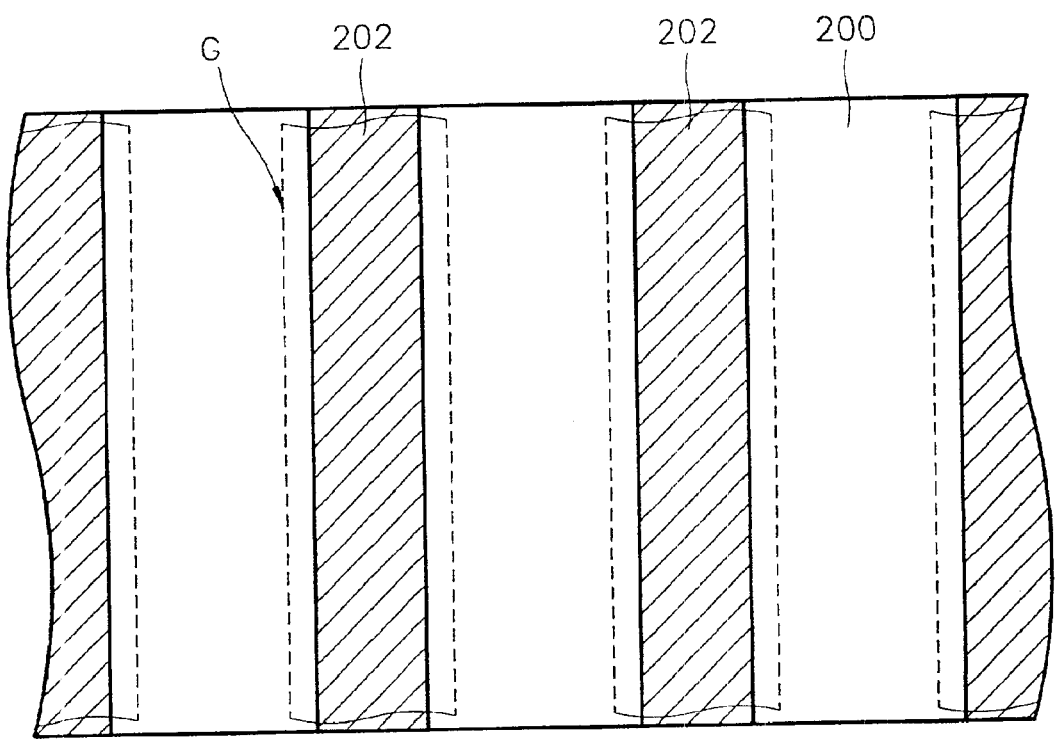
FIG. 4 is a plan view of photoresist patterns according to another embodiment of the present invention.
Figure 5A:
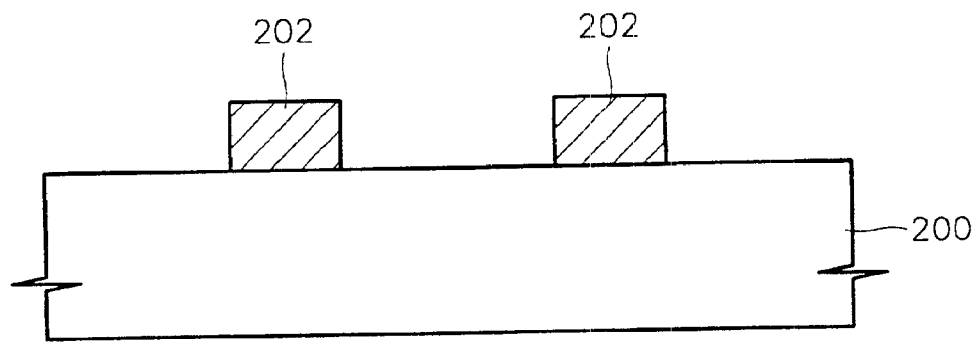
FIGS. 5A to 5D are cross-sectional views of structures illustrating a fabricating method of a semiconductor device having grooves according to another embodiment of the present invention.

FIG. 4 is a plan view of photoresist patterns according to a second embodiment of the present invention. FIGS. 5A to 5D are cross-sectional views of structures illustrating a fabricating method of a semiconductor device having grooves according to a second embodiment of the present invention. In particular, FIG. 5A is a cross-sectional view taken along the V–V' line of FIG. 4.

Referring to FIGS. 4 and 5A, a plurality of photoresist patterns 202 are formed on a semiconductor substrate 200. According to an embodiment of the present invention, the plurality of photoresist patterns 202 are in stripes, and are formed on a region for forming a plurality of gate electrodes (to be formed). A symbol G denotes a region for forming a plurality of gate electrodes of a plurality of MOS transistors.

Figure 5B:
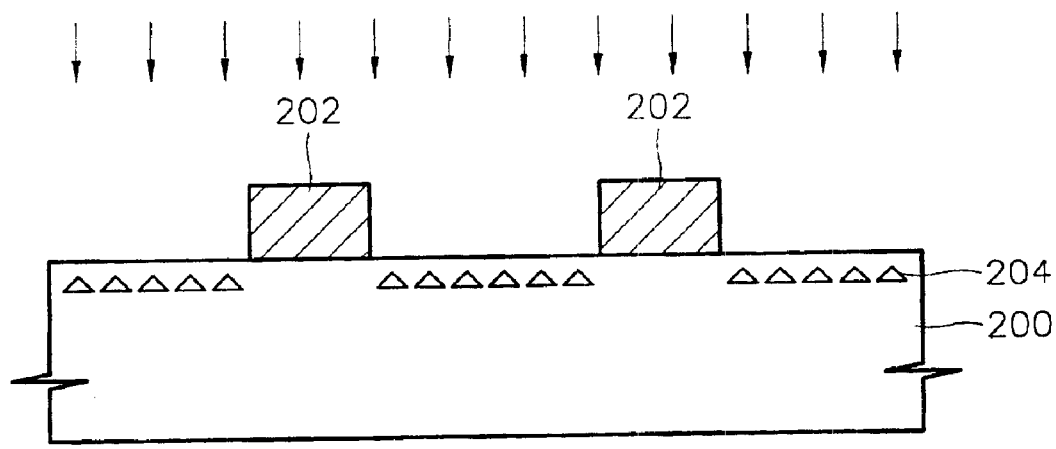

Referring to FIG. 5B, nitrogen ions 204 are implanted into the semiconductor substrate 200 using the photoresist patterns 202 as a mask. According to an embodiment of the present invention, the nitrogen ions 204 are implanted into conjunction regions (to be formed) because the photoresist patterns 202 are formed on regions for the plurality of gate electrodes (to be formed).

Figure 5C:
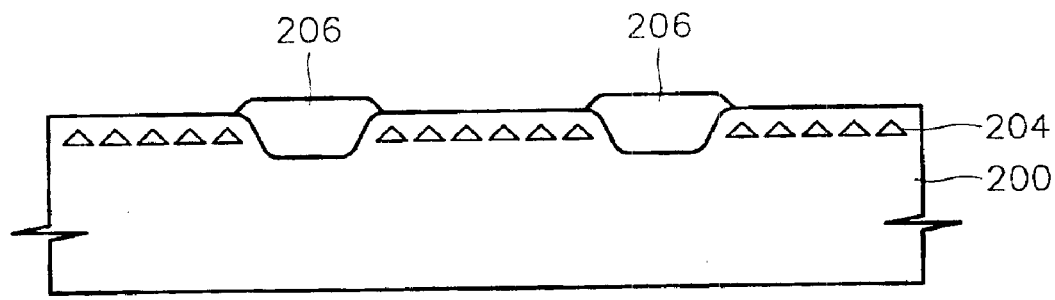

Referring to FIG. 5C, the photoresist patterns 202 are removed using a known process such as an ashing process. Next, a thermal oxide layer 206 is formed on the semiconductor substrate 200 by a thermal oxidation process. According to an embodiment of the present invention, the thermal oxide layer 206 is formed on nitrogen ion-free regions of the semiconductor substrate 200, which are regions having the plurality of photoresist patterns 202.

Figure 5D:
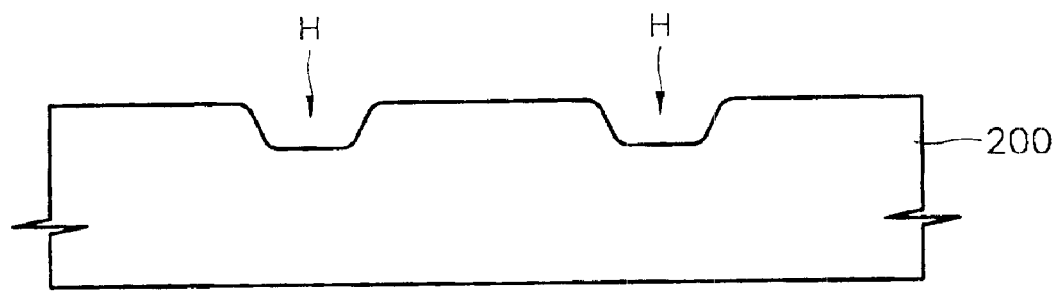

Referring to FIG. 5D, the thermal oxide layer 206 (in FIG. 5C) is removed by a wet etching process, then, a plurality of grooves H are formed on the semiconductor substrate 200. Next, a plurality of gate electrodes (not shown) are formed on the plurality of grooves H as described in the first embodiment.

According to an embodiment of the present invention, the plurality of grooves are formed after partially forming the oxidation layer on the semiconductor substrate without using a nitride layer pattern. Therefore, the effective channel length of the MOS transistor can be elongated without being subject to stress in the semiconductor substrate.

Figure 6A:
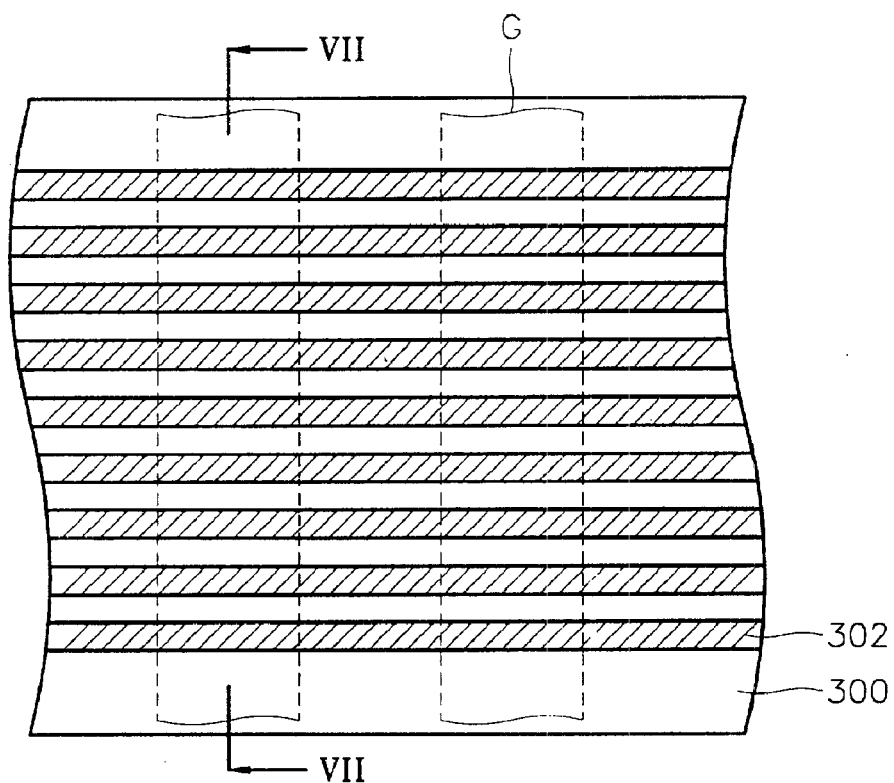
FIGS. 6A and 6B are plan views of photoresist patterns according to another embodiment of the present invention.
Figure 6B:
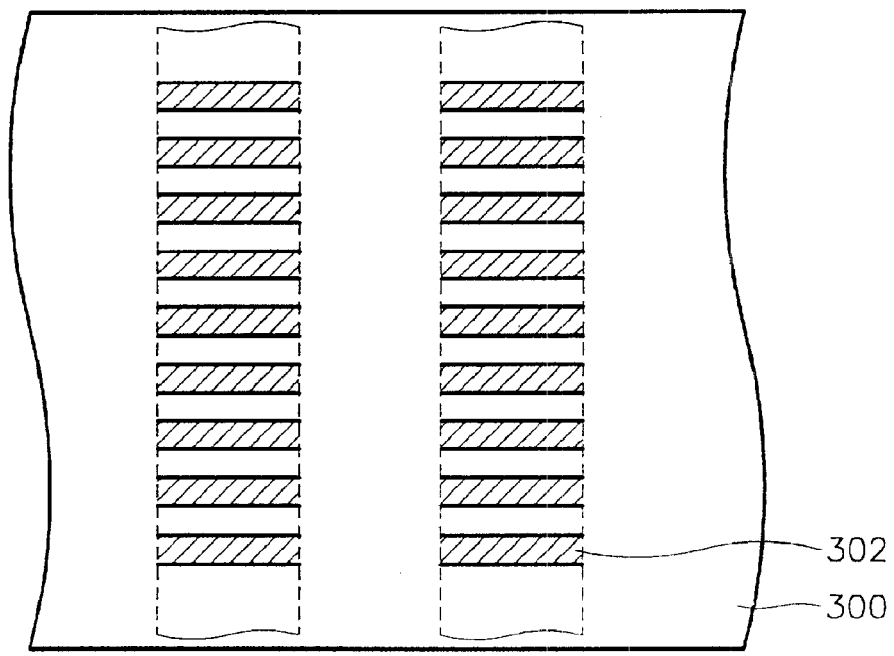
Figure 7A:
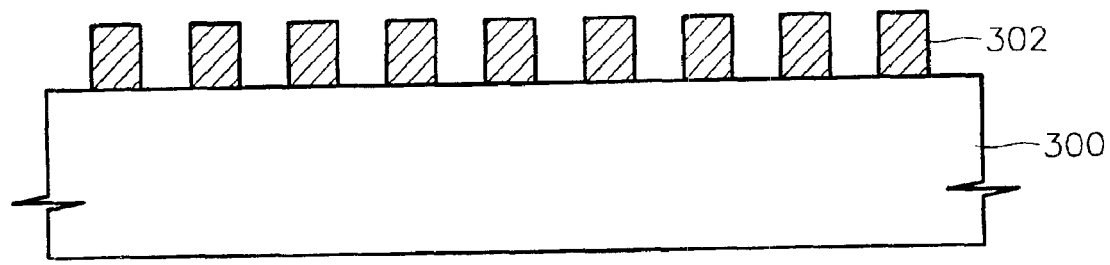
FIGS. 7A to 7E are cross-sectional views of structures illustrating a fabricating method of a semiconductor device having grooves according to another embodiment of the present invention.

FIGS. 6A and 6B are plan views of photoresist patterns according to a third embodiment of the present invention. FIGS. 7A to 7E, 8A, and 8B are cross-sectional views of structures illustrating a fabricating method of a semiconductor device having grooves according to a third embodiment of the present invention. In particular, FIG. 7A is a cross-sectional view taken along the VII–VII' line of FIG. 6A.

Referring to FIGS. 6A and 7A, a plurality of photoresist patterns 302 are formed on a semiconductor substrate 300 having device isolation regions (not shown). According to an embodiment of the present invention, the plurality of photoresist patterns 302 are perpendicular to regions for forming a plurality of gate electrodes (to be formed), and are disposed to have substantially equal distance therebetween and are disposed substantially in parallel to each other. The plurality of photoresist patterns 302 can be formed to be in strips as shown in FIG. 6A or can be selectively formed on regions for forming a plurality of gate electrodes (to be formed) of the semiconductor substrate 300 as shown in FIG. 6B.

Figure 7B:
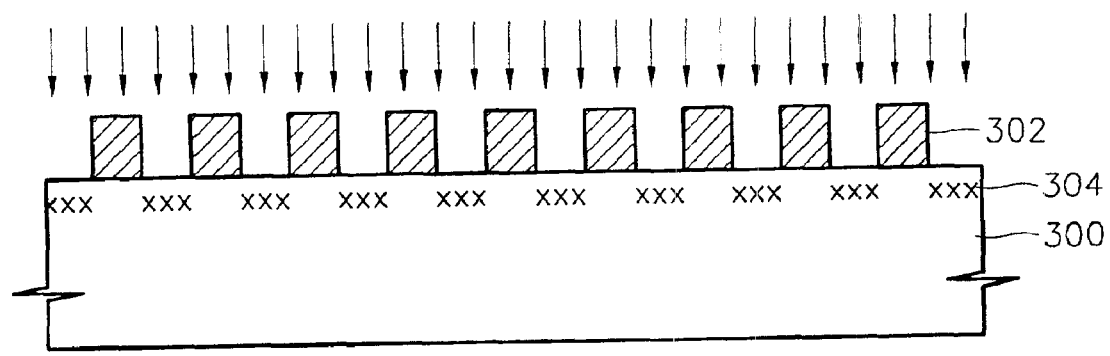

Referring to FIG. 7B, oxygen ions 304 are implanted into the semiconductor substrate 300 using the photoresist patterns 302 as a mask.

Figure 7C:
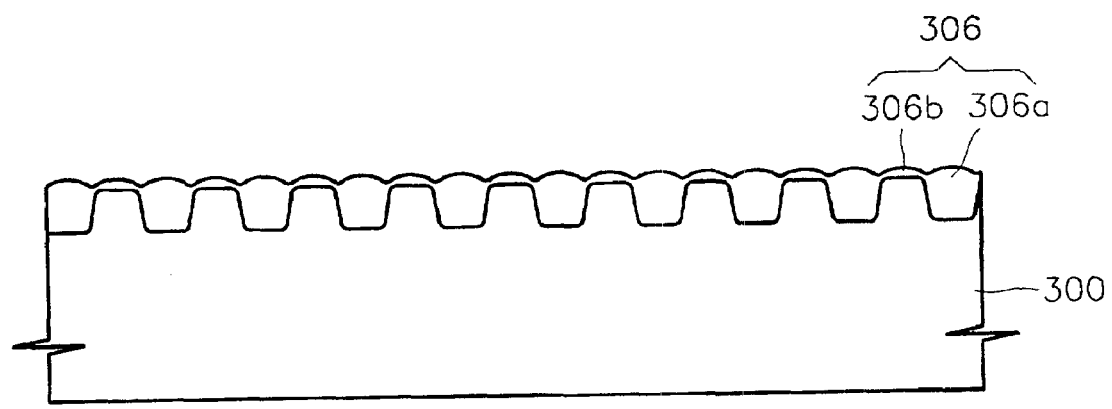

Referring to FIG. 7C, the photoresist patterns 302 are removed using a known process such as an ashing process. Next, a thermal oxide layer 306 is formed on the surface of the semiconductor substrate 300 by a thermal oxidation process. The thermal oxide layer 306 in a portion having the implanted oxygen ions 304 is formed thicker as shown in 306a, the thermal oxide layer 306 in a portion not having the implanted oxygen ions 304 is formed thinner as shown in 306b.

Figure 7D:
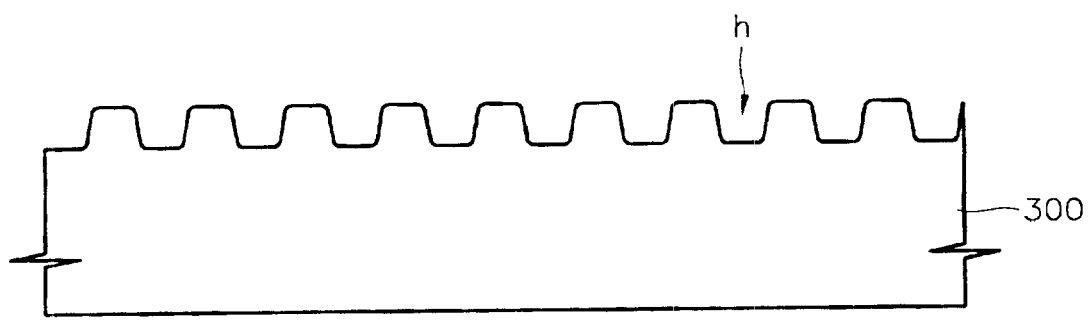

Referring to FIG. 7D, the thermal oxide layer 306 (in FIG. 7C) is removed by a wet etching process. Then, the semiconductor substrate 300 has a plurality of grooves "h" in a direction of a channel width (to be formed) of a plurality of MOS transistors, and the semiconductor substrate 300 has a concave/convex surface.

Figure 7E:
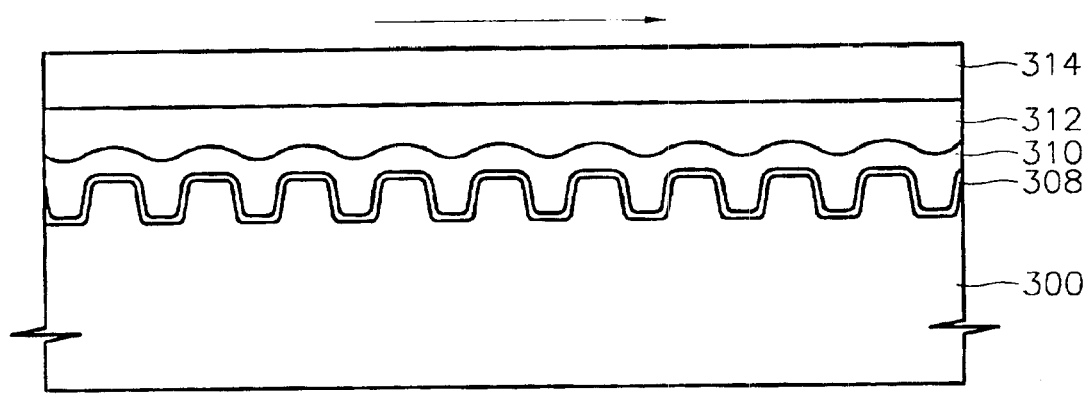

Referring to FIG. 7E, after cleaning the semiconductor substrate 300, a gate insulating layer 308, a conducting layer 310 for a gate electrode, a low resistance layer 312, and a hard mask layer 314 are sequentially formed on the semiconductor substrate 300 having the plurality of grooves "h". According to another embodiment of the present invention, the gate insulating layer 308, the conducting layer 310, the low resistance layer 312, and the hard mask layer 314 are formed with the same materials, respectively, as described in the first embodiment of the present invention. Next, the low resistance layer 312 is planarized by using an etch back process or a CMP process. Next, a portion of the hard mask layer 314, a portion of the low resistance layer 312, a portion of the conducting layer 310, and a portion of the gate insulating layer 308 are sequentially patterned to form a plurality of gate electrodes (not shown). Subsequent processes for forming the plurality of gate electrodes are similar to the first embodiment of the present invention. An arrow shows an extension direction of the gate electrode.

Figure 8A:
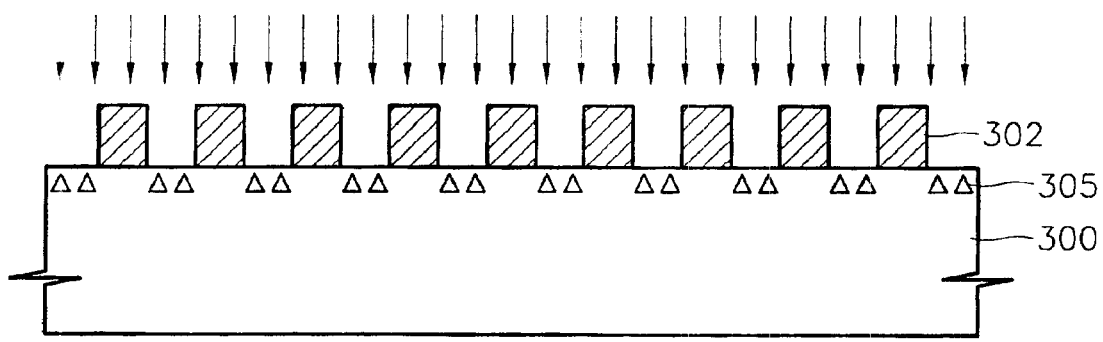
FIGS. 8A and 8B are cross-sectional views of structures illustrating a fabricating method of a semiconductor device having grooves according to another embodiment of the present invention.
Figure 8B:
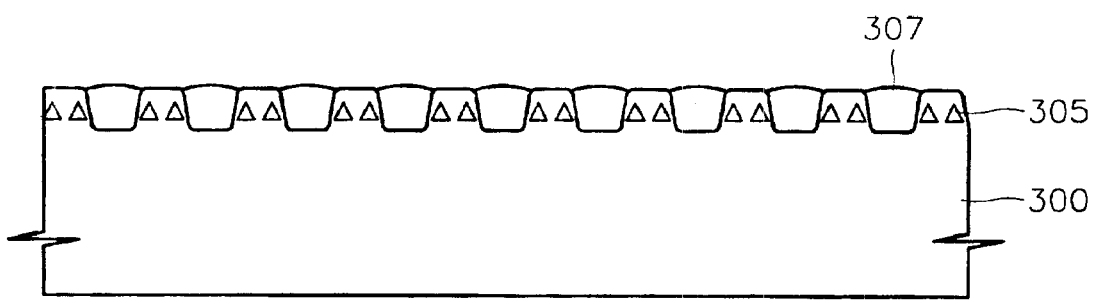

Referring to FIG. 8A, nitrogen ions 305 instead of oxygen ions 304 can be implanted to the semiconductor substrate 300. After implanting the nitrogen ions 305, the photoresist patterns 302 are removed. Next, a thermal oxide layer 307 is formed on the surface of the semiconductor layer 300. At this time, thermal oxidation is inhibited at the portion implanted with the nitrogen ions 305. The portion of the surface having the nitrogen ions 305 prevents grooves from being formed thereunder. Next, the thermal oxide layer 307 is removed to form a plurality of grooves as described in the first embodiment of the present invention. Thus, the position of grooves formed from the thermal oxide layer 307 shown in FIG. 8B is reversed from the position of the grooves shown in FIG. 7C on the semiconductor substrate 300. However, the process of forming the plurality of grooves is still in the same direction as the channel width; therefore, the precise position of the plurality of grooves on the semiconductor substrate 300 is not critical.

According to an embodiment of the present invention, the plurality of the grooves are formed in the direction of a channel width and the plurality of the grooves elongates the channel width, thereby improving current characteristics of the MOS transistor. During forming the plurality of the grooves, as a nitride layer is not formed on the semiconductor substrate, the effective channel length of the MOS transistor can be elongated without being subject to stress.

Figure 9:
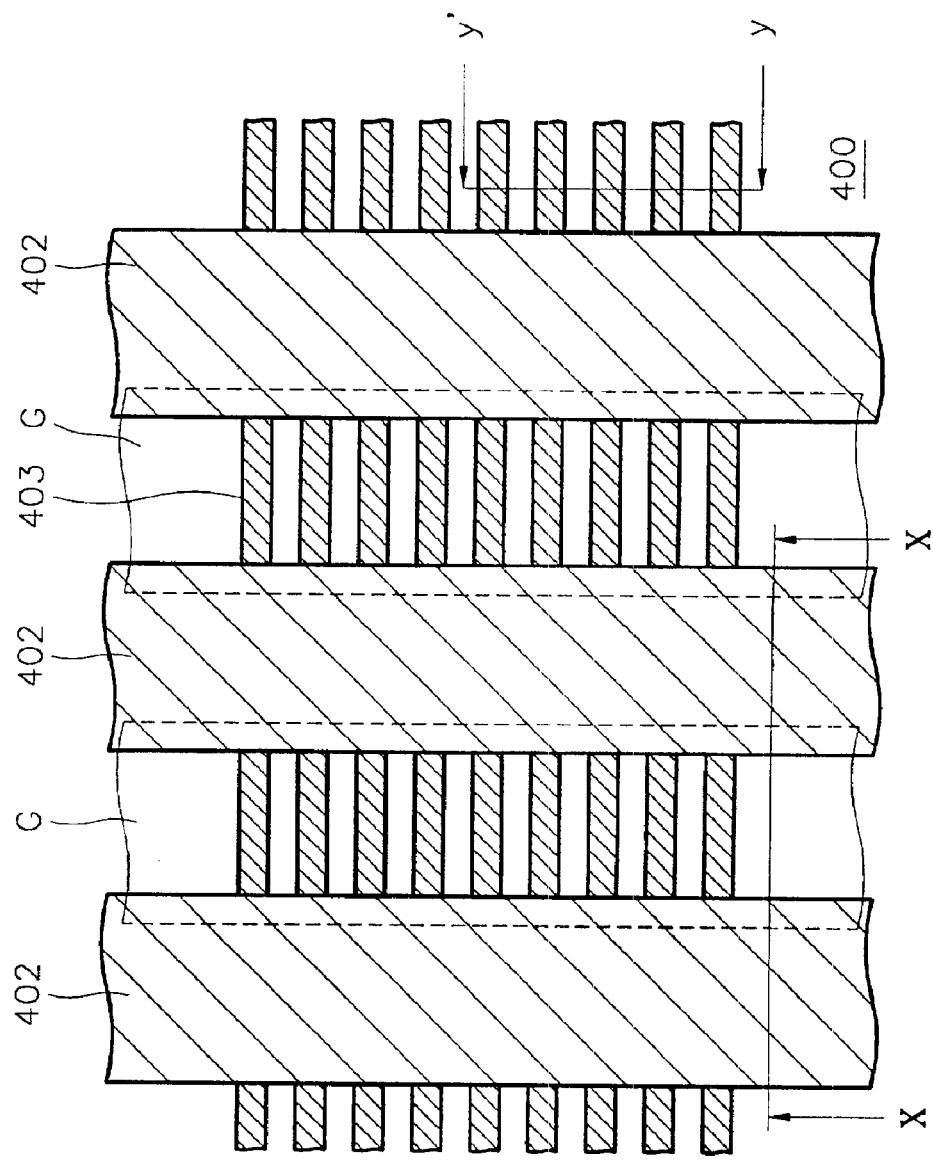
FIG. 9 is a plan view of photoresist patterns according to another embodiment of the present invention.
Figure 10A:
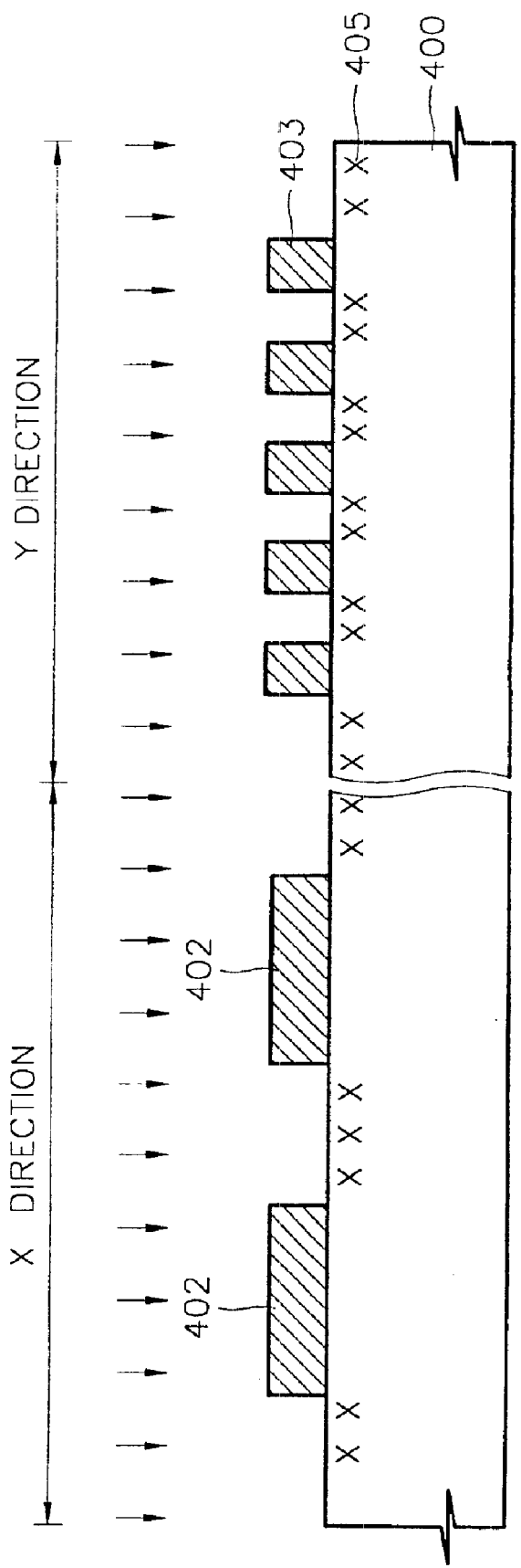

FIG. 9 is a plan view of a photoresist pattern, and FIGS. 10A and 10B are cross-sectional views of structures illustrating a fabricating method of a semiconductor device having grooves according to another embodiment of the present invention. In particular, an X-direction and a Y-direction of FIGS. 10A and 10B are cross-sectional views taken along the X–X' line and Y–Y' line of FIG. 9, respectively.

Referring to FIGS. 9 and 10A, a plurality of first photoresist patterns 402 are formed on a semiconductor substrate 400 to expose channel regions (to be formed). A plurality of second photoresist patterns 403 are formed on the channel regions of the semiconductor substrate 400 to selectively expose a portion of the channel regions. For example, the plurality of second photoresist patterns 403 are formed between the plurality of first photoresist patterns 402 and perpendicular to the plurality of first photoresist patterns 402. The width of each of the plurality of second photoresist patterns 403 is fine as compared to the width of each of the plurality of first photoresist patterns 402. Next, oxygen ions 405 are implanted into the semiconductor substrate 400 using the plurality of first and second photoresist patterns 402 and 403 as a mask.

Next, after removing the plurality of first and second photoresist patterns 402 and 403, a thermal oxide layer (not shown) is formed on the surface of the semiconductor substrate 400 by a thermal oxidation process. The thermal oxide layer is removed to form a plurality of grooves H and h. The symbol H denotes the plurality of grooves formed in a X-direction and the symbol h denotes the plurality of grooves in a Y-direction.

Referring to FIG. 10B, after cleaning the semiconductor substrate 400, a gate insulating layer 408, a conducting layer 410 for a gate electrode, a low resistance layer 412, and a hard mask layer 414 are sequentially formed on the semiconductor substrate 400 having the plurality of grooves H and h. According to an embodiment of the present invention, the gate insulating layer 408, the conducting layer 410, the low resistance layer 412, and the had mask layer 414 are formed with the same materials, respectively, as described in the first embodiment of the present invention. Then, subsequent processes for forming a plurality of gate electrodes 416 are similar to the first embodiment of the present invention.

According to an embodiment of the present invention, the plurality of grooves H and h are formed in vertical and horizontal directions of the channel regions, respectively. Accordingly, the channel length and width can be concurrently elongated without being subject to stress.

As described above, a plurality of grooves can be formed in a longitudinal and horizontal direction of the channel regions of MOS transistors without forming a nitride layer pattern, the effective channel length of the MOS transistor can be increased without being subject to stress in the semiconductor substrate.

Although the present invention has been described herein with reference to the accompanying drawings, it is to be understood that the present invention is not limited to those precise embodiments, and various other changes and modifications may be affected therein by one skilled in the art without departing from the scope or spirit. It will be apparent to one of ordinary skill in the art that modifications of the described embodiment may be made without departing from the spirit and scope of the invention. All such changes and modifications are intended to be included within the scope of the invention as defined by the appended claims.

What is claimed is:

1. A method for forming a plurality of grooves of a semiconductor device having a plurality of MOS transistors, comprising the steps of:

forming a plurality of photoresist patterns on a semiconductor substrate;

implanting ions on the semiconductor substrate using the plurality of photoresist patterns as a mask;

removing the plurality of photoresist patterns;

forming an oxide layer on the semiconductor substrate having the implanted ions by thermal oxidation; and forming the plurality of grooves on the semiconductor substrate by removing the oxide layer, wherein the plurality of grooves are formed in a channel region of the plurality of MOS transistors.

2. The method of claim 1, wherein each of the plurality of photoresist patterns is spaced apart from another on a plurality of channel regions of the plurality of MOS transistors to expose the plurality of channel regions in the semiconductor substrate.

3. The method of claim 2, wherein the ions are oxygen ions and the oxide layer is formed thicker in a portion of the semiconductor substrate having the oxygen ions than in a portion of the semiconductor substrate not having the oxygen ions.

4. The method of claim 1, wherein the plurality of photoresist patterns are formed on a corresponding plurality of channel regions of the plurality of MOS transistors.

5. The method of claim 4, wherein the ions are nitrogen ions and the oxide layer is formed on a portion of the semiconductor substrate not having the nitrogen ions.

6. The method of claim 1, wherein a plurality of channel regions are formed parallel to a channel length and the plurality of the photoresist patterns are disposed along a longitudinal direction to expose the plurality of channel regions.

7. The method of claim 6, wherein the ions are oxygen ions and the oxide layer is formed thicker in a portion of the semiconductor substrate having the oxygen ions than in a portion of the semiconductor substrate not having the oxygen ions.

8. The method of claim 6, wherein the ions are nitrogen ions and the oxide layer is formed on a portion of the semiconductor substrate not having the nitrogen ions.

9. The method of claim 1, wherein the step of forming the plurality of photoresist patterns comprises the steps of:

forming a plurality of first photoresist patterns, each of the plurality of first photoresist patterns is disposed in between channel regions of the plurality of the MOS transistors;

forming a plurality of second photoresist patterns between each of the plurality of first photoresist patterns, the plurality of second photoresist patterns being orthogonal to the plurality of first photoresist patterns.

10. The method of claim 1, wherein a width of each of the plurality of grooves is the same as or smaller than a channel region.

11. The method of claim 1, further comprising the steps of:
   forming a gate insulating layer on the semiconductor substrate having the plurality of grooves;
   forming a gate electrode on the gate insulating layer; and
   forming junction regions in both sides of the gate electrode.

12. A method for forming a plurality of grooves of a semiconductor device having a plurality of MOS transistors, comprising the steps of:
   forming a plurality of photoresist patterns on a semiconductor substrate;
   implanting ions on the semiconductor substrate using the plurality of photoresist patterns as a mask to form ion regions in the semiconductor substrate between the photoresist patterns and to form ion-free regions in the semiconductor substrate under the photoresist patterns;
   removing the plurality of photoresist patterns;
   forming an oxide layer on the semiconductor substrate in the ion-free regions of the semiconductor substrate by thermal oxidation after the removal of the photoresist patterns; and
   forming the plurality of grooves on the semiconductor substrate by removing the oxide layer, wherein the plurality of grooves are formed in a channel region of the plurality of MOS transistors.

* * * * *